United States Patent
Hori et al.

(10) Patent No.: US 7,172,956 B2
(45) Date of Patent: Feb. 6, 2007

(54) SUBSTRATE FOR SEMICONDUCTOR LIGHT-EMITTING ELEMENT, SEMICONDUCTOR LIGHT-EMITTING ELEMENT AND SEMICONDUCTOR LIGHT-EMITTING ELEMENT FABRICATION METHOD

(75) Inventors: Yuji Hori, Grenoble (FR); Osamu Oda, Nishikasugai-gun (JP); Mitsuhiro Tanaka, Handa (JP); Bruno Daudin, Grenoble Cedex (FR); Eva Monroy, Grenoble Cedex (FR)

(73) Assignees: NGK Insulators, Ltd., Nagoya (JP); Commissariat a l'Energie Atomique, Paris (FR)

( * ) Notice: Subject to any disclaimer, the term of this patent is extended or adjusted under 35 U.S.C. 154(b) by 12 days.

(21) Appl. No.: 11/095,450

(22) Filed: Mar. 31, 2005

(65) Prior Publication Data

US 2005/0170539 A1    Aug. 4, 2005

Related U.S. Application Data

(62) Division of application No. 10/813,565, filed on Mar. 30, 2004, now Pat. No. 6,943,366.

(30) Foreign Application Priority Data

Mar. 31, 2003    (EP) .................................. 03290809

(51) Int. Cl.
*H01L 21/28* (2006.01)
*H01L 29/06* (2006.01)
(52) U.S. Cl. ........................................ 438/602; 257/13

(58) Field of Classification Search .................. 257/13, 257/94, 102–103; 438/602–606
See application file for complete search history.

(56) References Cited

U.S. PATENT DOCUMENTS 5,488,233 A    1/1996    Ishikawa et al.

(Continued)

FOREIGN PATENT DOCUMENTS

EP    1 211 737 A2    6/2002

(Continued)

OTHER PUBLICATIONS

Shibata T et al: "Characterization of high-quality epitaxial AlN films grown by MOVPE", GAN and Related Alloys—2001. Symposium (Material Research Society Symposium Proceedings vol. 693), GAN and Related Alloys—2001, Boston, MA, USA, Jan. 26-30, 2001, pp. 541-544, XP001168620, 2002, Warrendale, PA, USA, Mater. Res. Soc., USA *abstract*.

(Continued)

*Primary Examiner*—Calvin Lee
(74) *Attorney, Agent, or Firm*—Burr & Brown

(57) ABSTRACT

A group III nitride underlayer including at least Al, having a dislocation density of $\leq 1 \times 10^{11}/cm^2$ and a (002) plane X-ray rocking curve half-width value of $\leq 200$ seconds is formed on a set base material. A p-type semiconductor layer group is formed above the group III nitride underlayer and includes a group III nitride in which the Ga content relative to the total group III elements is $\geq 50\%$ and in which a carrier density is $\geq 1 \times 10^{16}/cm^3$. A light-emitting layer is formed on the p-type semiconductor layer group and includes plural mutually isolated insular crystals. An n-type semiconductor layer group is formed on the light-emitting layer and includes a Ga content relative to the total group III elements of $\geq 50\%$.

4 Claims, 2 Drawing Sheets

U.S. PATENT DOCUMENTS

| | | | |
|---|---|---|---|
| 5,740,192 | A | 4/1998 | Hatano et al. |
| 6,153,894 | A | 11/2000 | Udagawa ..................... 257/96 |
| 6,462,357 | B1 | 10/2002 | Tsai et al. ..................... 257/97 |
| 6,555,846 | B1 | 4/2003 | Watanabe et al. ............. 257/94 |
| 2002/0053679 | A1 | 5/2002 | Nikolaev et al. |
| 2002/0136932 | A1 | 9/2002 | Yoshida |

FOREIGN PATENT DOCUMENTS

| | | |
|---|---|---|
| WO | 00/63961 | 10/2000 |

OTHER PUBLICATIONS

Saxler A et al: "High quality aluminum nitride epitaxial layers grown on sapphire substrates", Applied Physics Letters, Jan. 17, 1994, USA, vol. 64, No. 3, pp. 339-341, XP002256572, ISSN: 0003-6951 *p. 340*.

Ohba Y et al: "Growth of high-quality AlN and AlN/GaN/AlN heterostructure on sapphire substrate" Japanese Journal of Applied Physics, Part 2 (Letters), Aug. 15, 1996, Publication Office Japanese Journal Appl. Phys. Japan, vol. 35, No. 8B, pp. L1013-L1015, XP002256573, ISSN: 0021-4922 *L1013-L1014*.

Kaufmann U et al: "Hole conductivity and compensation in epitaxial GaN:Mg layers" Physical Review B (Condensed Matter), Oct. 15, 2000, APS Through AIP, USA, vol. 62, No. 16, pp. 10867-10872, XP002256574, ISSN: 0163-1829 *p. 10867*.

Santic B et al: "Current transport mechanism and I-V characteristics of titanium and indium contacts to p-type GaN" Materials Science & Engineering B (Solid-State Materials for Advanced Technology), May 30, 2002, Elsevier, Switzerland, vol. B93, pp. 202-206, XP002255818, ISSN: 0921-5107, *the whole document*.

Bhargava R N: "The role of impurity in doped nanocrystals" 1996 International Conference on Luminescence and Optical Spectroscopy of Condensed Matter, Prague, Czech Republic, Aug. 18-23, 1996, vol. 72-74, pp. 46-48, XP002255817, Journal of Luminscene, Jun. 1997, Elsevier, Netherlands, ISSN: 0022-2313 *the whole document*.

Zhang J et al: "INGAN Self-Assembled Quantum Dots Grown by Metalorganic Chemical-Vapor Deposition with Indium as the Antisurfactant" Applied Physics Letters, American Institute of Physics, New York, US, vol. 80, No. 3, Jan. 21, 2002, pp. 485-487, XP001093504, ISSN: 0003-6951 *p. 485*.

PRIOR ART

US 7,172,956 B2

SUBSTRATE FOR SEMICONDUCTOR LIGHT-EMITTING ELEMENT, SEMICONDUCTOR LIGHT-EMITTING ELEMENT AND SEMICONDUCTOR LIGHT-EMITTING ELEMENT FABRICATION METHOD

CROSS REFERENCE TO RELATED APPLICATIONS

This application is a division of U.S. application Ser. No. 10/813,565 filed Mar. 30, 2004 issued as U.S. Pat. No. 6,943,366 and claims the benefit of European Application 03290809.7, filed Mar. 31, 2003, the entireties of which are incorporated herein by reference.

FIELD OF THE INVENTION

The present invention relates to a semiconductor light-emitting element and a method of fabrication thereof and to a substrate for a semiconductor light-emitting element.

BACKGROUND OF THE INVENTION

Group III nitrides are used as semiconductor films by which light-emitting semiconductor elements are formed, and in recent years there have been hopes for them as semiconductor films in semiconductor light-emitting elements constituting, in particular, high-luminance light sources for green light to blue light and also light sources for ultraviolet light and white light.

FIG. 1 is a block diagram showing one example of a conventional so-called PN type semiconductor light-emitting element.

In the semiconductor light-emitting element 10 shown in FIG. 1, the following are successively formed on a substrate 1, which is formed, for example, from a sapphire single crystal: a buffer layer 2 constituted by GaN, an underlayer 3 constituted by Si-doped n-GaN, an n-type electrically conductive layer 4 constituted by Si-doped n-AlGaN, a light-emitting layer 5, a p-type clad layer 6 constituted by Mg-doped p-AlGaN and a p-type electrically conductive layer 7 constituted by Mg-doped p-GaN.

The light-emitting layer 5 can be constituted as a single group III nitride layer or as a multiple-quantum-well (MQW) structure, and in recent years in particular it can also be constituted as a quantum dot structure. This quantum dot structure presents a structure in which, as, for example, shown in FIG. 2, crystals 12-1–12-5 in the form of islands constituted by GaInN are formed in a base layer 17 constituted by GaN. These insular structures may be mutually isolated or they may be connected to one another. The specific form of the insular structures depends on the conditions of their fabrication. In this example, the insular structures 12-1–12-5 are so constituted that they are mutually isolated.

A portion of the n-type conductive layer 3 is exposed and an Al/Ti or similar n-type electrode 8 is formed on this exposed portion, and, further, an Au/Ni or similar p-type electrode 9 is formed on the p-type conductive layer 7. The imposition of a set voltage across the n-type electrode 8 and the p-type electrode 9 results in recombination of carriers in the light-emitting layer 5 and emission of light of a set wavelength. This wavelength is determined by the light-emitting layer's structure and composition, etc.

In the semiconductor light-emitting element shown in FIG. 1, the underlayer 3 and the n-type conductive layer 4 constitute an n-type conductor layer group, while the p-type clad layer 6 and the p-type electrode 7 constitute a p-type conductor layer group.

In order to make practical use of the semiconductor light-emitting element shown in FIG. 1, it is necessary to place the semiconductor light-emitting element 10 in an atmosphere which does not contain hydrogen, and then give the p-type conductor layer group constituted by the p-type clad layer 6 and p-type electrode 7 an activation treatment by effecting a heating treatment at a temperature of 400° C. or more, and lower the resistance value to a set value, eg, by separating and removing the element hydrogen which has combined with the Mg which was added as a dopant (Japanese Patent No. 25407991).

However, when the light-emitting layer 5 is constituted as a quantum dot structure such as shown in FIG. 2, the activation treatment at such a high temperature sometimes causes a breakdown of the quantum dot structure. As a result, it is not possible to fabricate short-wavelength semiconductor light-emitting elements which can operate practical applications.

The object of the present invention is to provide a semiconductor light-emitting element which can serve in practical applications, and in which a p-type semiconductor layer group and an n-type semiconductor layer group are deposited on a set substrate, a quantum dot structure type light-emitting layer is provided between the p-type semiconductor layer group and the n-type semiconductor layer group, and the resistance of the p-type semiconductor layer group is lowered sufficiently, and to provide a substrate for this semiconductor light-emitting element. It is also an object to provide a method of fabricating this semiconductor light-emitting element.

SUMMARY OF THE INVENTION

In order to achieve the above objects, the present invention relates to a substrate for a semiconductor light-emitting element which includes, on a set base material, a group III nitride underlayer which contains at least Al, in which the dislocation density is $\leq 1\times10^{11}/cm^2$ and whose (002) plane X-ray rocking curve half-width value is $\leq 200$ seconds. A p-type semiconductor layer group is formed on the group III nitride underlayer and is constituted by a group III nitride in which the Ga content relative to the total group III elements is $\geq 50\%$ and in which the carrier density is $\geq 1\times10^{16}/cm^3$. A light-emitting layer is formed on the p-type semi-conductor layer, which presents the form of insular crystals constituted by a group III nitride and which produces quantum effects. An n-type semiconductor layer group is formed on the light-emitting layer and in which the Ga content relative to the total group III elements is $\geq 50\%$.

The invention further relates to a semiconductor light-emitting element which includes a set base material having a group III nitride underlayer formed thereon, which contains at least Al, in which the dislocation density is $\leq 1\times10^{11}/cm^2$ and whose (002) plane X-ray rocking curve half-width value is $\leq 200$ seconds. A p-type semiconductor layer group is formed on the group III nitride underlayer, which is constituted by a group III nitride in which the Ga content relative to the total group III elements is $\geq 50\%$ and in which the carrier density is $\geq 1\times10^{16}/cm^3$. A light-emitting layer is formed on the p-type semiconductor layer, which presents the form of insular crystals constituted by a group III nitride and which produces quantum effects. An n-type semiconductor layer group is formed on the light-emitting layer and in which the Ga content relative to the total group III elements is $\geqq 50\%$.

Further, the invention relates to a semiconductor light-emitting element fabrication method which includes: a step of forming, on a set base material, a group III nitride underlayer, which contains at least Al, has a dislocation density of $\leqq 1 \times 10^{11}/cm^2$ and whose (002) plane X-ray rocking curve half-width value is $\leqq 200$ seconds; a step of forming, on the group III nitride underlayer, a p-type semiconductor layer group which is constituted by a group III nitride in which the Ga content relative to the total group III elements is $\geqq 50\%$; a step of forming, on the p-type semiconductor layer, a light-emitting layer which presents the form of insular crystals constituted by a group III nitride and which produces quantum effects; and a step of forming, on the light-emitting layer, an n-type semiconductor layer group in which the Ga content relative to the total group III elements is $\geqq 50\%$.

The present inventors conducted intensive research in order to achieve the objects noted above. As a result of this research, a group III nitride underlayer, such as described above, which contains Al and high crystal quality is provided on a set substrate, and a p-type semiconductor layer group and an n-type semiconductor layer group are constituted by group III nitrides having Ga as a principal component. Further, it was discovered that by following the fabrication method of the invention, reversing the deposition order of the p-type semiconductor layer group and n-type semiconductor layer group in a conventional semiconductor element structure, such as shown in FIG. 1, and forming the above noted p-type semiconductor layer group with a carrier density of $\leqq 1 \times 10^{16}/cm^3$ before the light-emitting layer and the above-noted n-type semiconductor layer group are deposited, a light-emitting layer can be constituted and the resistance of above-noted p-type semiconductor layer group can be reduced sufficiently without causing a breakdown of the quantum dot structure which produces quantum effects. Thus, according to the invention, a semiconductor light-emitting element, which has a light-emitting layer possessing a quantum dot structure, can serve in practical applications and can be provided by a very simple process.

According to the invention, at the time of carrier confinement, since the light-emitting layer presents the form of a quantum dot structure, carrier confinement can be satisfactorily achieved even without making use of a double heterodyne structure such as one in which a quantum well structure is employed. Therefore, there is no need for the provision of a clad layer which is such as employed in a double heterodyne structure, etc. and whose bandgap is greater than that of the light-emitting layer. This is because the bandgap of the matrix material of the light-emitting layer containing the quantum dots is greater than the bandgap of the quantum dots in the light-emitting layer, and, consequently, a double heterodyne structure is formed in the light-emitting layer. In this Specification, a double heterodyne structure such as this will be called a pseudo-double-heterodyne structure.

Further, if the arrangement is made such that the light-emitting layer is constituted by plural layers, the result is that plural pseudo-double-heterodyne structures are formed in the light-emitting layer, and the carrier confinement effect is further improved.

However, the invention is not one in which clad formation is completely excluded. As in the past, the carrier confinement effect can be improved by forming a clad layer adjacent to the light-emitting layer.

Formation of a p-type semiconductor layer group whose carrier density is equal to or greater than that noted above can be achieved by effecting an activation treatment in the form of a heat treatment at a high temperature after the p-type semi-conductor layer group has been formed, or by forming the p-type semiconductor layer group by a MBE procedure. A combination of these two procedures is of course effective.

According to the invention, sufficient activation and reduction of the resistance of the above noted p-type semiconductor layer group can be effected and a semiconductor light-emitting element, which can serve in practical applications, can be provided not only in the case of a heat treatment at a high temperature, such as noted above, but also in the case in which a heat treatment is effected at quite a low temperature.

The "insular crystals" in the invention can be so formed that they are mutually independent or they can be formed in a reticulate form in which they are mutually connected via thin layers. The specific forms depend on the insular crystals' fabrication conditions, etc.

BRIEF DESCRIPTION OF THE DRAWINGS

For a full understanding of the nature and objects of the invention, reference should be made to the following detailed description of the invention, read in connection with the accompanying drawings in which.

DETAILED DESCRIPTION OF THE INVENTION

Below, a form of implementation of the invention will be described in detail.

Figure 3:
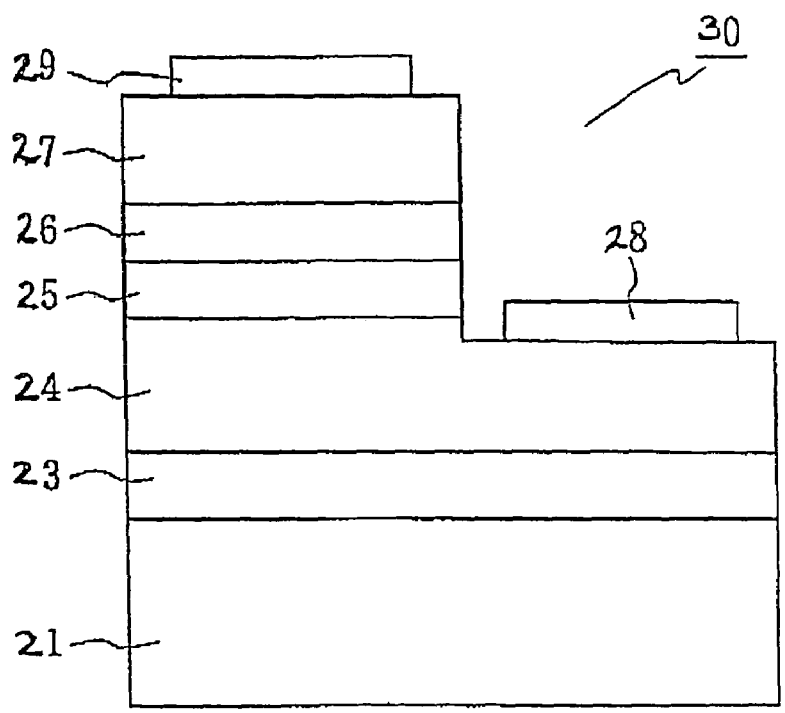
FIG. 3 is a block diagram showing one example of a semiconductor light-emitting element of the invention.

FIG. 3 is a block diagram showing one example of the semiconductor light-emitting element of the invention. In the semiconductor light-emitting element 30 shown in FIG. 3, an underlayer 23, a p-type electrically conductive layer 24, a light-emitting layer 25, an n-type clad layer 26 and an n-type electrically conductive layer 27 are successively provided on a substrate 21. Further, a portion of the p-type conductive layer 24 is exposed, a p-type electrode 28 constituted by, eg Au/Ni is formed on this exposed p-type conductive layer 24, and an n-type electrode 29 constituted by, eg Al/Ti is formed on the n-type conductive layer 27, thereby producing a so-called PN type semiconductor light-emitting element.

Figure 2:
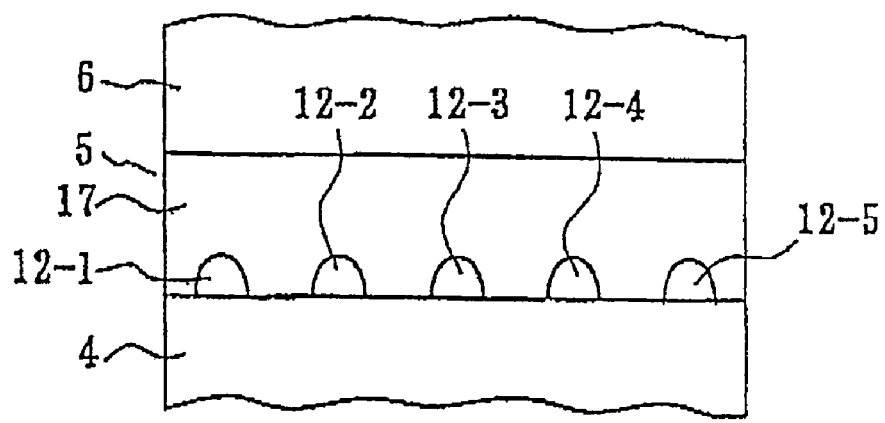
FIG. 2 is a schematic showing the structure of a light-emitting layer which constitutes a semiconductor light-emitting element.

The light-emitting layer 25 presents the form of a quantum well structure in which, as shown in FIG. 2, plural insular crystals 12-1-12-5, which are constituted by a set group III nitride, are disposed to be mutually isolated from one another in a base layer 17, which is also constituted by a set group III nitride.

In FIG. 3, the p-type conductive layer 24 constitutes a p-type semiconductor layer group, and the n-type clad layer 26 and the n-type conductive layer 27 constitute an n-type semiconductor layer group. If so desired, it is also possible to omit the n-type clad layer 26.

According to the invention, it is necessary that the underlayer 23 be constituted by a high crystal quality group III nitride which contains Al, in which the dislocation density is $\leq 1\times 10^{11}/cm^2$ and whose (002) plane X-ray rocking curve half-width value is $\leq 200$ seconds. This results in the p-type conductive layer 24 which is formed on the underlayer 23 acquiring substantially the same excellent crystal quality as that of the underlayer 23.

Since the p-type conductive layer 24 has good crystal quality, in cases such as in which it is formed by a MBE procedure, since the MBE deposition is effected in the absence of hydrogen, high temperature procedures to activate the p-type dopant are not required after growth to the active region which, in turn, prevents thermal degradation on the quantum structures. Moreover, the proportion of hydrogen uptake in the layer can be reduced so that the amount of hydrogen that combines with the dopant in the p-type conductive layer 24 can be reduced, and the result is therefore that the p-type conductive layer 24 has a high carrier density such as noted below.

Apart from the use of MBE procedures, in the case of the use of a CVD procedure, if the p-type conductive layer 24 is given an activation treatment by effecting a heating treatment in an atmosphere which does not contain hydrogen, hydrogen which has bonded with the dopant in the p-type semiconductor layer 24 can be efficiently separated and removed. Consequently, the p-type conductive layer 24 comes to have a high carrier density such as noted below. As a result, a semi-conductor light-emitting element 30 which is employable in practical applications and possesses a light-emitting layer with a quantum dot structure can easily be produced.

It is necessary that the carrier density in the p-type conductive layer 24 is $\geq 1\times 10^{16}/cm^3$, and it is still more preferable if the carrier density is $\geq 1\times 10^{17}/cm^3$. With this, the voltage drop in the p-type layer can be suppressed, a voltage can be imposed on the light-emitting layer 25 efficiently, and the light emission efficiency can be improved. In particular, these effects become very marked when the light-emitting layer is constituted by plural layers.

The above-noted dislocation density is preferably $\leq 5\times 10^{10}/cm^2$, and still more preferably it is $\leq 1\times 10^{10}/cm^2$. Also, it is preferable that the above noted X-ray rocking curve half-width value is $\leq 100$ seconds, and it is still more preferable that it be $\leq 60$ seconds.

Further, the surface roughness Ra is preferably $\leq 3$ Å. This measurement is made in the range of a 5 μm square by means of an atomic force microscope (AFM).

The greater the Al content in the group III nitride constituting the underlayer 23, the more the dislocations originating in the substrate 21 become entangled at the interface of the substrate 21 and the underlayer 23, with consequent reduction of the proportion that propagates into the underlayer 23. As a result, the dislocation density in the underlayer 23 is reduced and the crystal quality of the underlayer 23 is improved. It is therefore preferable that group III nitride constituting the underlayer 23 contain as much Al as possible, and, specifically, it is preferable that it contain Al in a proportion that is $\geq 50\%$ relative to the total group III elements, and still more preferably Al constitutes the totality of the group III elements, and the underlayer 23 is constituted by AlN.

The underlayer 23 preferably has a great film thickness, and, specifically, it is preferably formed to a thickness of $\geq 0.1$ μm, $\geq 0.5$ μm being still more preferable. There are no particular restrictions regarding the upper limit of the thickness of the underlayer 23, and this is suitably selected and set taking into account the occurrence of cracks and the purpose of use, etc.

Apart from Al, the underlayer 23 can also contain other group III elements such as Ga and In, etc. and additional elements such as B, Si, Ge, Zn Be and Mg, etc Also, there is not a limitation to deliberately added elements, but it can also contain trace elements which are inevitably taken in depending on the film formation conditions, and trace amounts of impurities which are contained in the source materials and the reaction tube material.

As long as it satisfies the above-noted requirements, the underlayer 23 can be formed by known film forming means. It can easily be produced by using a MOCVD procedure and setting the film formation temperature to 1100° C. or more. It is noted that the film formation temperature means the set temperature of the substrate 21. From considerations of suppression of surface roughening, etc. of the underlayer 23, it is preferable that the film formation temperature be not more than 1250° C.

It is necessary that the p-type conductive layer 24 be constituted by a group III nitride in which the Ga content relative to the total group III elements is $\geq 50\%$. This makes it possible to activate the p-type conductive layer 24 sufficiently to make its carrier density $\geq 1\times 10^{16}/cm^3$ and to lower its resistance. In the invention the greater the Ga content in the group III nitride constituting the p-type conductive layer 24, the better, and, specifically, this content is preferably $\geq 70\%$, and still more preferably Ga constitutes the totality of the group III elements, and the layer consists of GaN.

The p-type conductive layer 24 contains a p-type dopant such as Zn, Be or Mg, etc. Also, it can contain Al and In, etc. as well as Ga. Further, there is not a limitation to deliberately added elements but it can also contain trace elements which are inevitably taken in depending on the film formation conditions, etc. and trace amounts of impurities which are contained in the source materials and the reaction tube material.

If the p-type layer is given an activation treatment, this is effected after the formation of the p-type conductive layer 24 and before the formation of the light-emitting layer 25. Specifically, after the production of a multilayer film structure in which, subsequent to the formation of the p-type conductive film 24, the substrate 21, underlayer 23 and p-type conductive layer 24 are stacked, a heating treatment of this multilayer film structure is effected in an atmosphere which does not contain hydrogen, eg, in a vacuum, in nitrogen gas or in an atmosphere of an inert gas such as He, Ne, Ar, Kr or Xe, etc. The temperature at this time is set to 300–1100° C. The treatment time is made, eg, 10 minutes–1 hour. The above noted temperature is the set temperature of the substrate 21.

Figure 4:
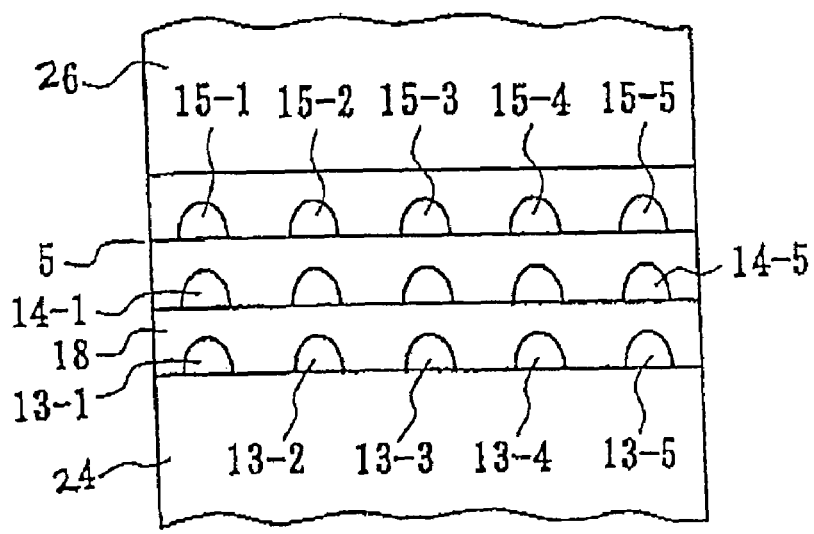
FIG. 4 is a schematic showing the structure of a light-emitting layer which constitutes a semiconductor light-emitting element.

Apart from the case in which the light-emitting layer 25 has insular crystals 12-1–12-5 formed as a single stage in the base layer 17 in the manner shown, for example, in FIG. 2, insular crystals 13-1–13-5; 14-1–14-5 and 15-1–15-5 may be formed in plural stages in a base layer 18 in the manner shown in FIG. 4. Such insular crystals can, for example, be produced by making the lattice constant of the group III nitride which constitutes the insular crystals of the light-emitting layer 25 large relative to the lattice constant of the group III nitride which constitutes the p-type conductive layer 24. Thus, insular crystals can be formed on the p-type conductive layer 24 by selecting respective group III nitrides in a manner such that these conditions are satisfied, applying known film formation technology to these nitrides and successively forming the p-type conductive layer 24 and the light-emitting layer 25.

The insular crystals are formed to a minute size such that quantum effects are produced.

At the time of formation of insular crystals in the light-emitting layer, it is desirable to effect formation by supplying In source material beforehand, and then effecting simultaneous supply of other group III source materials and group V source materials. This procedure makes it possible for formation of the insular structure to be effected with good control to a desired size.

Localized carriers recombine in the insular crystals constituting the light-emitting layer 25, and any desired light can be produced and emitted on the basis of this. Thus, light of any desired colour from red to blue can be caused to be produced and emitted by suitably controlling the size of the insular crystals, and it is also possible to cause white light to be produced and emitted by superimposing these colours on one another.

The light-emitting layer 25 can be constituted by a group III nitride which contains at least one out of Al, Ga and In, etc. Also, there is no limitation to deliberately added elements, but the layer can also contain trace elements which are inevitably taken in depending on the film formation conditions, etc. and trace amounts of impurities that are contained in the source materials and the reaction tube material.

For the n-type conductive layer 27, it is necessary that the Ga content relative to the total group III elements is $\geq 50\%$, and preferably this content is $\geq 70\%$, and still more preferably the layer consists of GaN. This makes it possible to form a good pn junction with the p-type conductive layer 24. The n-type conductive layer 27 contains an n-type dopant such as B, Si or Ge, etc. Also, it can contain Al and In as well as Ga. Also, there is no limitation to deliberately added elements, but the layer can also contain trace elements which are inevitably taken in depending on the film formation conditions, etc. and trace amounts of impurities that are contained in the source materials and the reaction tube material.

The n-type clad layer 26 can be constituted by a group III nitride which contains at least one out of Al, Ga and In, etc. Also, the n-type clad layer 26 contains an n-type dopant such as B, Si or Ge, etc.

The layers from the p-type conductive layer 24 to the n-type conductive layer 27 described above can be formed by known film formation methods, and, as noted earlier, they can be formed easily by a MOCVD procedure. They can also be formed by a LPE procedure or a MBE procedure. The use of a MBE procedure is particularly preferable, since it makes precise control possible in the process of formation of a light-emitting layer with the quantum dot structure.

The substrate 21 can be constituted by known substrate materials such as a sapphire single crystal, a ZnO single crystal, an $LiAlO_2$ single crystal, an $LiGaO_2$ single crystal, an $MgAl_2O_4$ single crystal, an MgO single crystal or similar oxide single crystal, an Si single crystal, an SiC single crystal or a similar group IV or group IV—IV single crystal, a GaAs single crystal, an AlN single crystal, a GaN single crystal, an AlGaN single crystal or similar group III–V single crystal, or a boride single crystal such as $ZrB_2$, etc.

EXAMPLE

In this example of implementation, the PN type semiconductor light-emitting element 30 shown in FIG. 3 was fabricated. A two-inch diameter, 500 μm thick C-plane sapphire single crystal was used as the substrate 21, and this was placed in an MOCVD unit, for which $H_2$, $N_2$, TMA (trimethylaluminium), TMG (trimethylgallium), $Cp_2Mg$, $NH_3$ and $SiH_4$ were laid on as a gas system. After the pressure had been set to 100 torr, the temperature of the substrate 21 was raised to 1100° C. while $H_2$ was flowed at an average flow rate of 1 m/sec.

After that, set quantities of TMA and $NH_3$ were supplied, and an AlN layer was grown to a thickness of 1 μm as the underlayer 23. In this process, the TMA and $NH_3$ feed rates were so set that the film formation rate was 0.3 μm/hr. When examined by means of a TEM, the dislocation density in this AlN film was found to be $1 \times 10^{10}/cm^2$. When the AlN's(002) plane X-ray rocking curve was measured, its half-width value was found to be 60 seconds, and it was confirmed that the material had good crystal quality, the surface roughness (Ra) being $\leq 1.5$ Å.

Next, the substrate temperature was set to 1080° C., and then TMG, $NH_3$ and $Cp_2Mg$ were flowed at a total gas average flow rate of 1 m/sec, and a p-GaN layer doped with Mg was grown to a thickness of 3 μm as the p-type conductive layer 24. The source material feed rates were made such that the film formation rate was 3 μm/hr. The supply of $Cp_2Mg$ was made such that the carrier density became $1.0 \times 10^{18}/cm^3$.

Next, $N_2$ gas was introduced into the MOCVD unit to make the interior of the unit a nitrogen atmosphere. Next, an activation treatment of the above noted p-GaN layer was effected by making the substrate temperature 750° C. and holding for 1 hour. The carrier density of the p-GaN at this time was $5 \times 10^{17}/cm^2$.

Next, in order to protect the p-GaN layer that had been grown, TMG and $NH_3$ were flowed at an average flow rate of 10 m/sec, and a GaN film was grown to a thickness of 100 Å. After the growth was completed, the substrate to which the GaN film was attached was taken out and set in a MBE unit.

7N Ga, 7N In and 6N Al were used as solid sources for the MBE unit, and atomic nitrogen produced by a high-frequency plasma unit was used as a nitrogen source. An Si solid source for producing n-type material was provided as a dopant source.

First, the substrate was heated to 900° C., and then the GaN film which had become a protective layer was removed by flowing $H_2$. After that, insular crystals for constituting the light-emitting layer 25 were grown from $In_{0.25}Ga_{0.75}N$ at 600° C. to a thickness of 20 Å and an average diameter of 200 Å on the p-GaN layer constituting the p-type conductive layer 24. After that, taking the light-emitting layer 24 as a base layer, a GaN layer was grown to a thickness of 50 Å at 600° C. in order to bury the isolated insular crystals.

Next, an Si-doped n-$Al_{0.05}Ga_{0.95}N$ layer was grown at 600° C. to a thickness of 50 Å as the n-type clad layer 26 on the above noted GaN layer, and finally an Si-doped n-GaN layer was grown at 600° C. to a thickness of 2000 Å as the n-type conductive layer 27.

Next, a portion of the p-GaN layer constituting the p-type conductive layer 24 was exposed by effecting partial etching removal of the various layers, and a p-type electrode 28 constituted by Au/Ni was formed on this exposed portion.

Also, an n-type electrode 29 constituted by Al/Ti was formed on the n-type GaN layer constituting the n-type conductive layer 27.

It was confirmed that blue light was emitted with an emission efficiency of 30 (lm/W) when drive was effected by imposing a voltage across the Au/Ni electrode and the Al/Ti electrode.

Comparative Example 1

A semiconductor light-emitting element was fabricated by procedure that was the same as in the example of implementation except that, instead of an AlN underlayer being formed, a GaN underlayer was formed to a thickness of 0.03 μm at a low temperature of 600° C. In this case, current did not flow in the semiconductor light-emitting element, and light was not emitted.

Comparative Example 2

Figure 1:
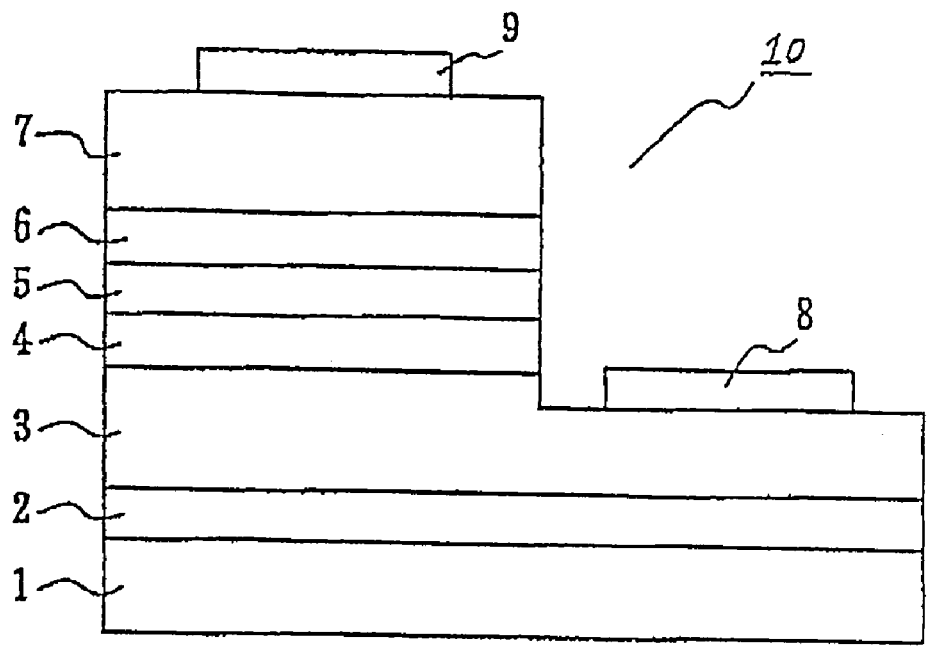
FIG. 1 is a block diagram showing one example of a conventional semi-conductor light-emitting element.

In this comparative example, the PN type semiconductor light-emitting element shown in FIG. 1 was fabricated.

A sapphire single crystal was used as the substrate 1, and was placed in an MOCVD unit like that of the example of implementation. After the substrate 1 had been heated to 400° C., TMG and $NH_3$ were supplied and a GaN layer was formed to a thickness of 0.03 μm as the buffer layer 2.

After that, the supply of TMG and $NH_3$ was temporarily halted, the substrate temperature was made 1120° C., TMG, $NH_3$ and $SiH_4$ were supplied, and an n-GaN layer 2 was formed at a film formation rate of 3 μm/hr to a thickness of 3 μm as the underlayer 3. Next, formation of the layers from the n-type conductive layer 4 to the p-type conductive layer 7 was effected in the same way as in the example of implementation. After that the semiconductor light-emitting element which had been produced was placed in a nitrogen atmosphere which did not contain hydrogen, and activation treatment was effected by heating to 750° C. and holding for 1 hour.

Then, the Al/Ti n-type electrode 8 and the Au/Ni p-type electrode 9 were formed, and it was ascertained that blue light was emitted with an emission efficiency of 10 (lm/W) when drive was effected by imposing a voltage across the Au/Ni electrode and Al/Ti electrode.

It is seen from the example of implementation and Comparative Example 1 that with a semiconductor light-emitting element possessing substrate/p-type semi-conductor layer group/light-emitting layer/n-type semiconductor layer group structure produced in accordance with the invention by forming a high crystal quality AlN underfilm and forming p-GaN, n-AlGaN and n-GaN on this AlN underfilm, the resistance of the overall element is made lower and the light emission efficiency is made better than in the case of the semiconductor light-emitting element in which a low crystal quality GaN underfilm is formed and the structure described above is formed on this GaN underfilm.

Further, it is seen from the example of implementation and Comparative Example 2 that in the case in which, in accordance with the invention, a p-type semi-conductor layer group is formed below a light-emitting layer and an n-type semi-conductor layer group is formed above so as to give a substrate/p-type semiconductor layer group/light-emitting layer/n-type semiconductor layer group structure it is possible to activate only the p-type semiconductor layer group before the light-emitting layer is formed, whereas in the case in which an n-type semiconductor layer group is formed below a light-emitting layer and a p-type semiconductor layer group is formed above the light-emitting layer so as to give a substrate/n-type semiconductor layer group/light-emitting layer/p-type semiconductor layer group structure, the result is that the activation treatment is effected with the structure from the n-type semi-conductor layer group to the p-type semiconductor layer group made integral. It was found that, consequently, breakdown of the quantum dot structure constituting the light-emitting layer was caused, and there was failure to achieve a satisfactory light emission efficiency.

Although, a specific example was taken and a detailed description of the present invention was given above with reference to a form of implementation of the invention, the invention is not limited to the content described above, but all sorts of variations and modifications are possible as long as there is no departure from scope of the invention.

For example, the substrate can be given a nitriding treatment, and pretreatment, etc. of the substrate with group III raw material can be effected. Further, it is possible to make the composition of the underlayer continuously varying, or to effect variation thereof with stepwise divisions made in the film formation conditions. Also, for the purpose of improving the crystallinity of a conductive layer and a light-emitting layer, etc. still more, a buffer layer or a multilayer structure such as a strain superlattice, etc. can be interposed between the underlayer and the conductive layer, etc. by varying growth conditions such as the temperature, flow rate, pressure, source material feed rates and added gases, etc.

Further, although the p-type semiconductor layer group was constituted solely by p-type conductive layers in the semiconductor light-emitting element described above, it is also possible to provide a p-type clad layer above these p-type conductive layers and constitute the p-type semiconductor layer group by the p-type conductive layers and the p-type clad layer.

Also, in the activation treatment of the p-type semiconductor layer group, this activation treatment can be accelerated by making the atmosphere in which the activation treatment is to be effected a plasma, or by imposing a high frequency on this atmosphere.

As described above, the invention makes it possible to provide a semi-conductor light-emitting element which can serve in practical applications, and in which a p-type semiconductor layer group and an n-type semiconductor layer group are deposited on a set substrate, a quantum dot structure type light-emitting layer is provided between the p-type semiconductor layer group and the n-type semiconductor layer group, and the p-type semiconductor layer group is made low-resistance by being sufficiently activation-treated, and to provide a substrate for this semiconductor light-emitting element. It is also made possible to provide a method of fabricating this semiconductor light-emitting element.

While the present invention has been particularly shown and described with reference to the preferred mode as illustrated in the drawings, it will be understood by one skilled in the art that various changes in detail may be effected therein without departing from the spirit and scope of the invention as defined by the claims.

What is claimed:

1. A semiconductor light-emitting element fabrication method comprises the steps of:
   forming a group III nitride underlayer on a set base material, said group III nitride underlayer contains at least Al, has a dislocation density of $\leqq 1\times 10^{11}/cm^2$ and a (002) plane X-ray rocking curve half-width value of $\leqq 200$ seconds;

forming a p-type semiconductor layer group above said group III nitride underlayer, said p-type semiconductor layer group comprising a group III nitride having a Ga content relative to the total group III elements present in the p-type semiconductor layer group of $\geqq 50\%$;

forming a light-emitting layer on said p-type semiconductor layer group, said light-emitting layer having the form of insular crystals comprising a group III nitride and produces quantum effects; and forming an n-type semiconductor layer group on said light-emitting layer, said n-type semiconductor layer group including a Ga content relative to the total group III elements present in the n-type semiconductor layer group of $\geqq 50\%$.

2. The semiconductor light-emitting element fabrication method as claimed in claim 1, wherein said group III nitride underlayer is formed by a MOCVD procedure at a temperature of $\geqq 1100°$ C.

3. The semiconductor light-emitting element fabrication method as claimed in claim 1, wherein said light-emitting layer is formed by supplying an In source material beforehand, and then effecting simultaneous supply of other group III source materials and group V source materials.

4. The semiconductor light-emitting element fabrication method as claimed in claim 1, wherein said light-emitting layer having said insular crystals and said n-type semiconductor layer group are formed by means of a MBE procedure.

* * * * *